United States Patent
Hsu et al.

(10) Patent No.: US 8,576,366 B2
(45) Date of Patent: Nov. 5, 2013

(54) PIXEL ARRAY

(75) Inventors: Hui-Ting Hsu, Taipei County (TW); Chu-Yu Liu, Hsinchu County (TW); Yu-Chieh Kuo, Taipei (TW); I-Chun Chen, Taoyuan County (TW); Jen-Wen Wan, Tainan (TW); Chou-Chin Wu, Taipei County (TW)

(73) Assignee: Au Optronics Corporation, Hsinchu (TW)

( * ) Notice: Subject to any disclaimer, the term of this patent is extended or adjusted under 35 U.S.C. 154(b) by 301 days.

(21) Appl. No.: 13/077,989

(22) Filed: Apr. 1, 2011

(65) Prior Publication Data
US 2012/0056207 A1 Mar. 8, 2012

(30) Foreign Application Priority Data
Sep. 8, 2010 (TW) .............................. 99130387 A

(51) Int. Cl.
*G02F 1/1343* (2006.01)
(52) U.S. Cl.
USPC ............... 349/143; 349/56; 349/84; 349/139; 349/146; 349/147
(58) Field of Classification Search
USPC ....................... 349/56, 84, 139, 143, 146, 147
See application file for complete search history.

(56) References Cited

U.S. PATENT DOCUMENTS

| | | | |
|---|---|---|---|
| 6,040,882 A | 3/2000 | Jun et al. | |
| 7,221,413 B2 | 5/2007 | Lai | |
| 7,453,086 B2 * | 11/2008 | Kim et al. | ........................ 257/59 |
| 7,599,035 B2 | 10/2009 | Park et al. | |
| 8,339,343 B2 * | 12/2012 | Chang | .............................. 345/87 |
| 2007/0296882 A1 | 12/2007 | Huang et al. | |
| 2008/0043161 A1 | 2/2008 | Liou et al. | |

FOREIGN PATENT DOCUMENTS

TW 200624972 7/2006

OTHER PUBLICATIONS

"First Office Action of China Counterpart Application", issued on Sep. 26, 2011, p. 1-p. 6, in which the listed references were cited.

* cited by examiner

*Primary Examiner* — Jennifer Doan
(74) *Attorney, Agent, or Firm* — Jianq Chyun IP Office

(57) ABSTRACT

A pixel array includes pixel sets. Each pixel set includes a first and second scan lines arranged in parallel on a substrate, a data line not parallel to the first and second scan lines, a first active device electrically connecting the first scan line and the data line, a second active device electrically connecting the second scan line and the data line, a first pixel electrode electrically connecting the first active device, a second pixel electrode electrically connecting the second active device, and an auxiliary electrode pattern that includes a connecting portion and a first and second branch portions. A gap is between the first and second pixel electrodes. The connecting portion underneath the gap between the first and second pixel electrodes partially overlaps the first and second pixel electrodes. The first and second branch portions connect the connecting portion and partially overlap the first and second pixel electrodes, respectively.

16 Claims, 3 Drawing Sheets

PIXEL ARRAY

CROSS-REFERENCE TO RELATED APPLICATION

This application claims the priority benefit of Taiwan application serial no. 99130387, filed Sep. 8, 2010. The entirety of the above-mentioned patent application is hereby incorporated by reference herein and made a part of this specification.

BACKGROUND OF THE INVENTION

1. Field of the Invention

The present invention relates to a pixel array. More particularly, the present invention relates to a pixel array of a display panel.

2. Description of Related Art

With advantages of high definition, small volume, light weight, low driving voltage, low power consumption, and a wide range of applications, a liquid crystal display (LCD) has replaced a cathode ray tube (CRT) display and has become the mainstream display product in the next generation. In general, an LCD panel is mainly comprised of an active device array substrate, a color filter substrate, and a liquid crystal layer.

To be more specific, the active device array substrate is constituted by a plurality of thin film transistors (TFTs) arranged in arrays and a plurality of pixel electrodes, and each of the pixel electrodes respectively corresponds to one of the TFTs. Here, the TFTs act as switch elements of an LCD unit. Besides, to control each individual pixel structure, a certain pixel structure is usually selected through a scan line and a data line, and display data corresponding to the certain pixel structure are displayed by providing an appropriate operating voltage. Practically, a capacitor electrode line is often disposed in each pixel structure in order to hold the operating voltage of the pixel structure. The overlapping region between the pixel electrode and the capacitor electrode line is where the storage capacitor is formed.

However, the capacitor electrode line results in reduction of the aperture ratio of the pixel structure. Hence, one of the most vigorously developed topics lies in the way to increase the aperture ratio of the pixel structure.

SUMMARY OF THE INVENTION

The present invention is directed to a pixel array in which auxiliary electrode patterns of pixel structures are specially designed to increase the aperture ratio of the pixel structures.

The present invention provides a pixel array that includes a plurality of pixel sets. Each of the pixel sets includes a first scan line and a second scan line that are arranged in parallel on a substrate, a data line that is not parallel to the first scan line and the second scan line, a first active device electrically connected to the first scan line and the data line, a second active device electrically connected to the second scan line and the data line, a first pixel electrode electrically connected to the first active device, a second pixel electrode electrically connected to the second active device, and an auxiliary electrode pattern. A gap is between the first pixel electrode and the second pixel electrode. The auxiliary electrode pattern includes a connecting portion, a first branch portion, and a second branch portion. The connecting portion is disposed underneath the gap between the first pixel electrode and the second pixel electrode and overlaps a portion of the first pixel electrode and a portion of the second pixel electrode. The first branch portion is connected to the connecting portion and overlaps a portion of the first pixel electrode. The second branch portion is connected to the connecting portion and overlaps a portion of the second pixel electrode.

The present invention further provides a pixel array that includes a plurality of pixel sets. Each of the pixel sets includes a first scan line and a second scan line that are arranged in parallel on a substrate, a data line that is not parallel to the first scan line and the second scan line, a first active device electrically connected to the first scan line and the data line, a second active device electrically connected to the second scan line and the data line, a first pixel electrode electrically connected to the first active device, a second pixel electrode electrically connected to the second active device, and an auxiliary electrode pattern. The auxiliary electrode pattern has a connecting portion, a first branch portion, and a second branch portion. The connecting portion is substantially disposed underneath a gap between the first pixel electrode and the second pixel electrode. The first branch portion is connected to the connecting portion and substantially perpendicular to the connecting portion. The second branch portion is connected to the connecting portion and substantially perpendicular to the connecting portion. The connecting portion, the first branch portion, and the second branch portion are substantially arranged in a shape of letter H.

Based on the above, the connecting portion of the auxiliary electrode pattern of the present invention is disposed underneath the gap between the first pixel electrode and the second pixel electrode. Accordingly, the connecting portion of the auxiliary electrode pattern can prevent light leakage at the gap between the first pixel electrode and the second pixel electrode. Besides, the auxiliary electrode pattern can further act as the electrode of the capacitor. The layout area of the auxiliary electrode pattern is smaller than that of the conventional capacitor electrode pattern, and therefore the aperture ratio of the pixel structure can be increased in the present invention.

In order to make the aforementioned and other features and advantages of the present invention comprehensible, embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
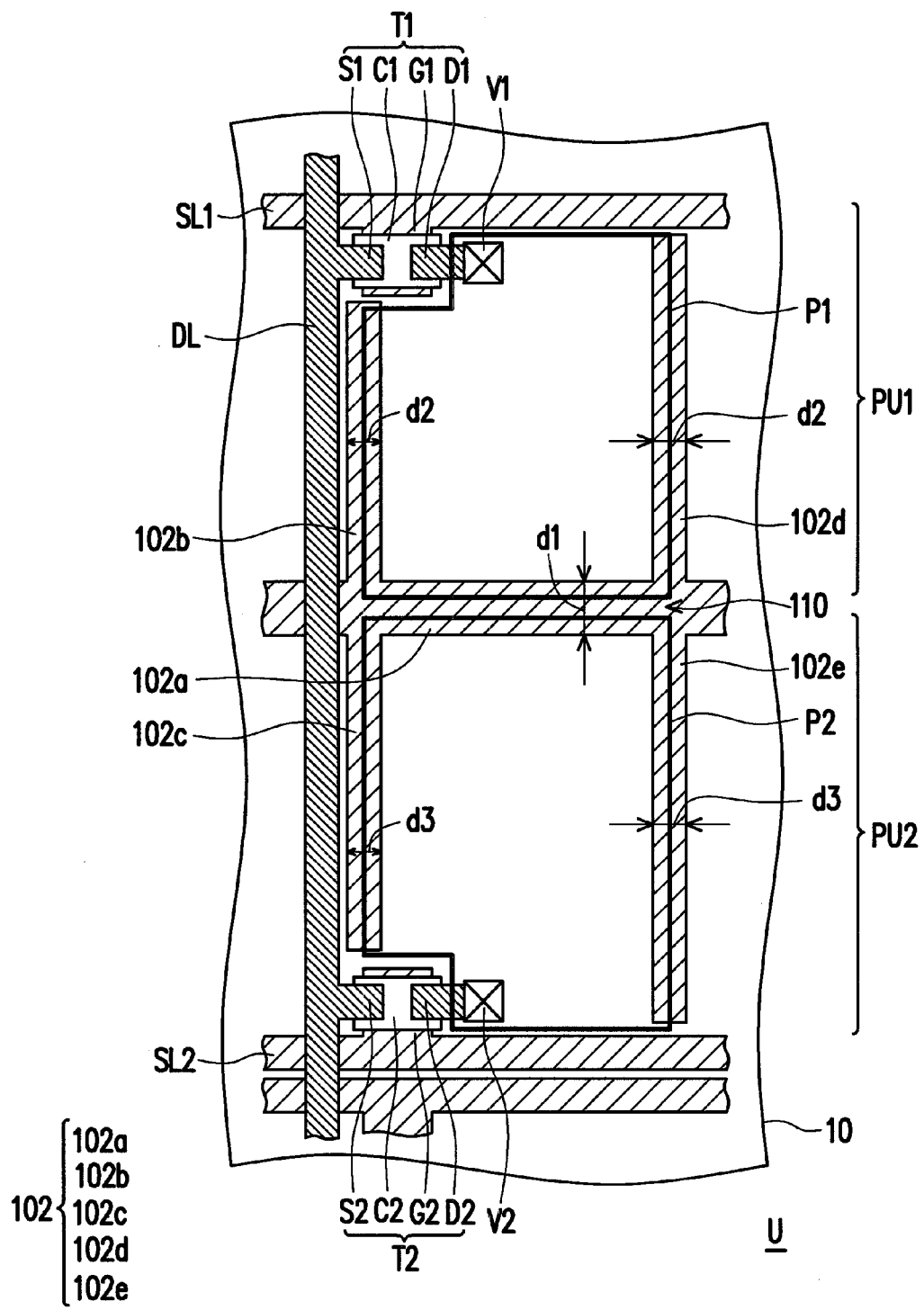
FIG. 1 is a schematic view illustrating a pixel array according to an embodiment of the present invention.

FIG. 1 is a schematic view illustrating a pixel array according to an embodiment of the present invention. With reference to FIG. 1, the pixel array of this embodiment includes a plurality of pixel sets U. In FIG. 1, only one of the pixel sets U in the pixel array is depicted to elaborate the present invention. Generally, the pixel array is constituted by a plurality of pixel sets U, and each of the pixel sets U of this embodiment includes two pixel structures PU1 and PU2. People having ordinary skill in the art should be aware of the entire structure of the pixel array based on the following description of the pixel sets U.

Each of the pixel sets U includes a first scan line SL1, a second scan line SL2, a data line DL, a first active device T1, a second active device T2, a first pixel electrode P1, a second pixel electrode P2, and an auxiliary electrode pattern 102 that are all disposed on a substrate 10.

Here, the substrate 10 is used to carry the elements of the pixel set u, and the substrate 10 can be made of glass, quartz, organic polymer, a non-light-transmissive/reflective material (e.g., a conductive material, wafer, ceramics, or any other suitable material), or any other suitable material.

The first scan line SL1 and the second scan line SL2 are arranged in parallel on the substrate 10. The data line DL is disposed on the substrate 10 and is not parallel to the first scan line SL1 and the second scan line SL2. In this embodiment, the first scan line SL1 and the second scan line SL2 are intersected with the data line DL. That is to say, an extending direction of the data line DL is not parallel to extending directions of the first and the second scan lines SL1 and SL2. Preferably, the extending direction of the data line DL is substantially perpendicular to the extending directions of the first and the second scan lines SL1 and SL2. The film layer where the data line DL is located is different from the film layer where the first scan line SL1 and the second scan line SL2 are located. In consideration of electrical conductivity, the first scan line SL1, the second scan line SL2, and the data line DL are often made of metallic materials. However, the first scan line SL1, the second scan line SL2, and the data line DL can also be made of other conductive materials in other embodiments, which should not be construed as a limitation to the present invention. The metallic material is, for example, an alloy, metal nitride, metal oxide, metal oxynitride, another appropriate material, or a layer in which the metallic material and any other conductive material are stacked to each other.

The first active device T1 is electrically connected to the first scan line SL1 and the data line DL. The second active device T2 is electrically connected to the second scan line SL2 and the data line DL. Specifically, the first active device T1 includes a gate G1, a channel C1, a source S1, and a drain D1. The gate G1 is electrically connected to the first scan line SL1. The channel C1 is located above the gate G1. The source S1 and the drain D1 are located above the channel C1, and the source S1 is electrically connected to the data line DL. The second active device T2 includes a gate G2, a channel C2, a source S2, and a drain D2. The gate G2 is electrically connected to the second scan line SL2. The channel C2 is located above the gate G2, for example. The source S2 and the drain D2 are located above the channel C2, and the source S2 is electrically connected to the data line DL. The first active device T1 and the second active device T2 are bottom-gate TFTs, for example, while the first active device T1 and the second active device T2 are not limited to the bottom-gate TFTs in the present invention. According to other embodiments of the present invention, the first active device T1 and the second active device T2 are top-gate TFTs.

The first pixel electrode P1 is electrically connected to the first active device T1. The second pixel electrode P2 is electrically connected to the second active device T2. In this embodiment, the first pixel electrode P1 is electrically connected to the drain D1 of the first active device T1 through a contact window V1. The second pixel electrode P2 is electrically connected to the drain D2 of the second active device T2 through a contact window V2. The first pixel electrode P1 and the second pixel electrode P2 can be made of a transparent conductive material or a reflective conductive material. The transparent conductive material includes metal oxide, such as indium tin oxide (ITO), indium zinc oxide (IZO), aluminum tin oxide (ATO), aluminum zinc oxide (AZO), indium germanium zinc oxide, other suitable oxide, or a stacked layer having at least two of the above materials. The reflective conductive material includes metal.

A gap 110 is between the first pixel electrode P1 and the second pixel electrode P2. Namely, the first pixel electrode P1 and the second pixel electrode P2 are independent electrode patterns and electrically insulated from each other. In this embodiment, the first pixel electrode P1 and the second pixel electrode P2 are both located between the first scan line SL1 and the second scan line SL2. That is to say, the first scan line SL1 and the second scan line SL2 are located at the uppermost portion and the bottommost portion of the pixel set U, respectively.

The first scan line SL1, the data line DL, the first active device T1, and the first pixel electrode P1 together constitute the pixel structure PU1. The second scan line SL2, the data line DL, the second active device T2, and the second pixel electrode P2 together constitute the pixel structure PU2.

The auxiliary electrode pattern 102 includes a connecting portion 102a, a first branch portion 102b, a second branch portion 102c, a third branch portion 102d, and a fourth branch portion 102e. In this embodiment, a material of the auxiliary electrode pattern 102 includes a light-shielding conductive material, such as an alloy, metal nitride, metal oxide, metal oxynitride, any other appropriate material, or a layer in which a metallic material and any other conductive material are stacked to each other. The auxiliary electrode pattern 102, the first scan line SL1, and the second scan line SL2 are in the same film layer in this embodiment. Besides, the material of the auxiliary electrode pattern 102 can be the same as the material of the first scan line SL1/the second scan line SL2. However, the present invention is not limited thereto.

The connecting portion 102a of the auxiliary electrode pattern 102 is disposed underneath the gap 110 between the first pixel electrode P1 and the second pixel electrode P2. The connecting portion 102a is further overlapped with a portion of the first pixel electrode P1 and a portion of the second pixel electrode P2. According to this embodiment, the connecting portion 102a is parallel to the first scan line SL1 and the second scan line SL2.

The first branch portion 102b of the auxiliary electrode pattern 102 is connected to the connecting portion 102a and overlapped with the left portion of the first pixel electrode P1. In this embodiment, the first branch portion 102b is connected to the connecting portion 102a and substantially perpendicular to the connecting portion 102a. Besides, the first branch portion 102b is substantially parallel to and adjacent to the data line DL. The length of the first branch portion 102b is smaller than that of the third branch portion 102d, for example. The length of the second branch portion 102c is smaller than that of the fourth branch portion 102e, for example.

The second branch portion 102c of the auxiliary electrode pattern 102 is connected to the connecting portion 102a and overlapped with the left portion of the second pixel electrode P2. In this embodiment, the second branch portion 102c is connected to the connecting portion 102a and substantially perpendicular to the connecting portion 102a. Besides, the second branch portion 102c is substantially parallel to and adjacent to the data line DL.

The third branch portion 102d of the auxiliary electrode pattern 102 is connected to the connecting portion 102a and overlapped with the right portion of the first pixel electrode P1. In this embodiment, the third branch portion 102d is connected to the connecting portion 102*a* and substantially perpendicular to the connecting portion 102*a*. Besides, the third branch portion 102*d* is substantially parallel to the data line DL.

The fourth branch portion 102*e* of the auxiliary electrode pattern 102 is connected to the connecting portion 102*a* and overlapped with the right portion of the second pixel electrode P2. In this embodiment, the fourth branch portion 102*e* is connected to the connecting portion 102*a* and substantially perpendicular to the connecting portion 102*a*. Besides, the fourth branch portion 102*e* is substantially parallel to the data line DL.

The connecting portion 102*a*, the first branch portion 102*b*, the second branch portion 102*c*, the third branch portion 102*d*, and the fourth branch portion 102*e* in this embodiment are substantially arranged in a shape of letter H.

The connecting portion 102*a* of the auxiliary electrode pattern 102 is disposed underneath the gap 110 between the first pixel electrode P1 and the second pixel electrode P2 according to this embodiment. Accordingly, the connecting portion 102*a* of the auxiliary electrode pattern 102 can prevent light leakage at the gap 110 between the first pixel electrode P1 and the second pixel electrode P2.

The auxiliary electrode pattern 102 not only can shield light but also can act as the capacitor electrode. Here, the capacitor electrode is a floating electrode/light-shielding electrode that can transmit the common voltage or does not transmit any voltage. To be more specific, the overlapping region between the first pixel electrode P1 and the connecting portion 102*a* and the first branch portion 102*b* of the auxiliary electrode pattern 102 is where the first capacitor is located, and the first capacitor can serve as the storage capacitor of the pixel structure PU1. In other words, the first pixel electrode P1 acts as the upper electrode of the first capacitor, and parts of the connecting portion 102*a* and the first branch portion 102*b* serve as the lower electrode of the first capacitor. A dielectric layer (not shown) between the first pixel electrode P1 (the upper electrode) and the connecting portion 102*a* and the first connecting portion 102*b* (the lower electrode) acts as the capacitor dielectric layer of the first capacitor. Similarly, the overlapping region between the second pixel electrode P2 and the connecting portion 102*a* and the second branch portion 102*c* of the auxiliary electrode pattern 102 is where the second capacitor is located, and the second capacitor can serve as the storage capacitor of the pixel structure PU2. In other words, the second pixel electrode P2 acts as the upper electrode of the second capacitor, and parts of the connecting portion 102*a* and the second branch portion 102*c* serve as the lower electrode of the second capacitor. A dielectric layer (not shown) between the second pixel electrode P2 (the upper electrode) and the connecting portion 102*a* and the second connecting portion 102*c* (the lower electrode) acts as the capacitor dielectric layer of the second capacitor.

According to an embodiment of the present invention, a width d1 of the connecting portion 102*a* of the auxiliary electrode pattern 102 is greater than a width d2 of the first branch portion 102*b*/the third branch portion 102*d* and is also greater than a width d3 of the second branch portion 102*c*/the fourth branch portion 102*e*. Namely, the width d1 of the connecting portion 102*a* is sufficient, such that the connecting portion 102*a* can be simultaneously overlapped with a portion of the first pixel electrode P1 and a portion of the second pixel electrode P2.

As provided in the above embodiment, the first pixel electrode P1 and the second pixel electrode P2 are respectively overlapped with the connecting portion 102*a* of the auxiliary electrode pattern 102 to form the storage capacitor of the pixel structure PU1 and the storage capacitor of the pixel structure PU2. That is to say, the connecting portion 102*a* of the auxiliary electrode pattern 102 serves as parts of the upper electrodes of both the storage capacitor of the pixel structure PU1 and the storage capacitor of the pixel structure PU2. Accordingly, compared to the conventional pixel structure, the pixel structure of this embodiment has a relatively high aperture ratio. The aperture ratio can be increased by approximately 2.1% if the auxiliary electrode pattern of the present invention is applied to the pixel structures with the same specifications.

Figure 2:
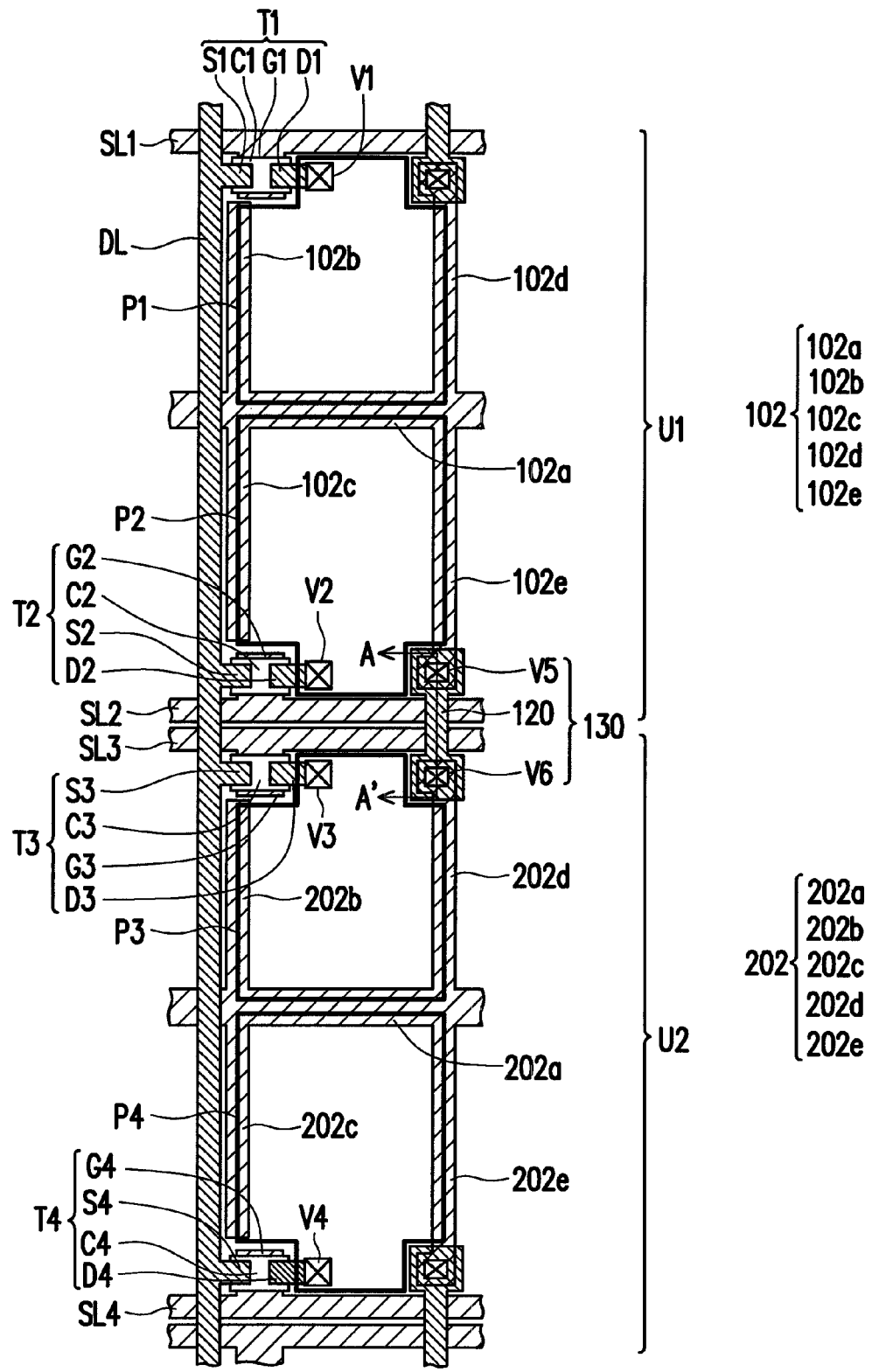
FIG. 2 is a schematic view illustrating a pixel array according to another embodiment of the present invention.
Figure 3:
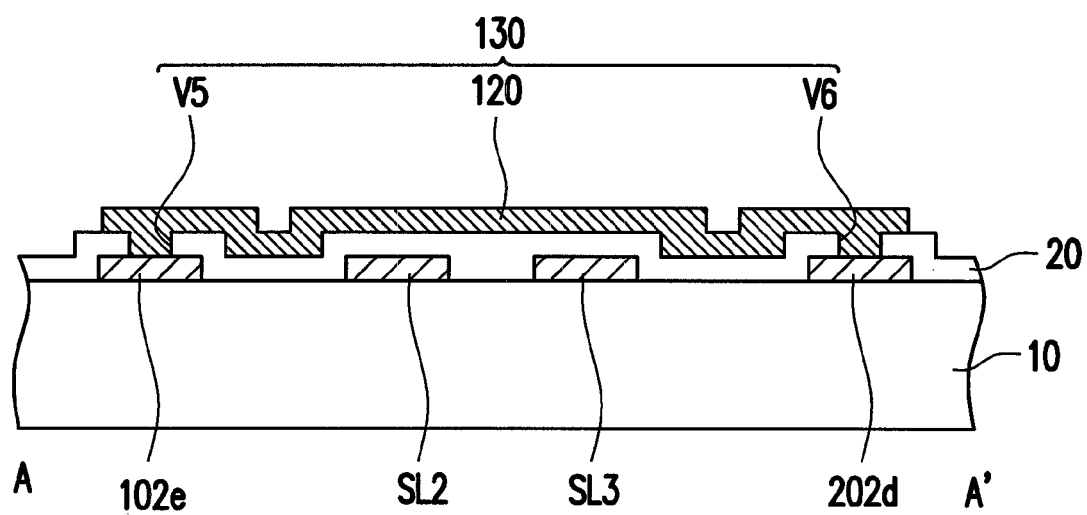
FIG. 3 is a schematic cross-sectional view taken along a sectional line A-A' depicted in FIG. 2.

FIG. 2 is a schematic view illustrating a pixel array according to another embodiment of the present invention. FIG. 3 is a schematic cross-sectional view taken along a sectional line A-A' depicted in FIG. 2. The embodiment shown in FIG. 2 is similar to the embodiment shown in FIG. 1, so that the same in FIG. 1 and FIG. 2 will be denoted with the same numerals and will not be repeated herein. It should be mentioned that two of the pixel sets U1 and U2 in the pixel array are depicted in FIG. 2, and each of the pixel sets U1 and U2 has two pixel structures, respectively. The components and the structure of the pixel set U2 are the same as or similar to those of the pixel set U1, and the pixel set U2 is adjacently connected to the pixel set U1.

With reference to FIG. 2, the pixel set U1 includes scan lines SL1 and SL2, a data line DL, active devices T1 and T2, pixel electrodes P1 and P2, and an auxiliary electrode pattern 102. The pixel set U2 includes scan lines SL3 and SL4, the data line DL, active devices T3 and T4, pixel electrodes P3 and P4, and an auxiliary electrode pattern 202. The scan lines SL3 and SL4 are parallel to the scan lines SL1 and SL2, and the scan line SL2 is adjacent to the scan line SL3. The active devices T1, T2, T3, T4 have gates G1, G2, G3, and G4, channels C1, C2, C3, and C4, sources S1, S2, S3, and S4, and drains D1, D2, D3, and D4. The pixel electrode P3 is electrically connected to the active device T3 through the contact window V3, and the pixel electrode P4 is electrically connected to the active device T4 through the contact window V4.

In particular, the auxiliary electrode pattern 102 of the pixel set U1 includes a connecting portion 102*a*, a first branch portion 102*b*, a second branch portion 102*c*, a third branch portion 102*d*, and a fourth branch portion 102*e*. The auxiliary electrode pattern 202 of the pixel set U2 includes a connecting portion 202*a*, a first branch portion 202*b*, a second branch portion 202*c*, a third branch portion 202*d*, and a fourth branch portion 202*e*.

The pixel array of this embodiment further includes a connecting structure 130 that is electrically connected to the auxiliary electrode pattern 102 of the pixel set U1 and the auxiliary electrode pattern 202 of the pixel set U2. To be more specific, with reference to FIG. 2 and FIG. 3, the connecting structure 130 includes a bridge structure 120 and contact windows V5 and V6.

The bridge structure 120 is disposed between the auxiliary electrode pattern 102 of the pixel set U1 and the auxiliary electrode pattern 202 of the pixel set U2. The contact window V5 is located in the overlapping region between the bridge structure 120 and the auxiliary electrode pattern 102 of the pixel set U1. The contact window V6 is located in the overlapping region between the bridge structure 120 and the auxiliary electrode pattern 202 of the pixel set U2.

In this embodiment, the bridge structure 120 crosses over the scan lines SL2 and SL3 and is electrically connected to the auxiliary electrode pattern 102 of the pixel set U1 and the auxiliary electrode pattern 202 of the pixel set U2. Specifically, an insulating layer 20 is sandwiched between the bridge structure 120 and the scan lines SL2 and SL3, such that the bridge structure 120 is electrically insulated from the scan lines SL2 and SL3, as indicated in FIG. 3. The insulating layer 20 can be made of a single-layer or multi-layer insulating material. The contact window V5 is located in the insulating layer 20 and between the bridge structure 120 and the fourth branch portion 102e of the auxiliary electrode pattern 102 of the pixel set U1. The contact window V6 is located in the insulating layer 20 and between the bridge structure 120 and the third branch portion 202d of the auxiliary electrode pattern 202 of the pixel set U2.

Similarly, the first pixel electrode P1 and the second pixel electrode P2 in the pixel set U1 of this embodiment are respectively overlapped with a portion of the connecting portion 102a of the auxiliary electrode pattern 102, so as to respectively form the storage capacitors of the two pixel structures in the pixel set U1. The first pixel electrode P3 and the second pixel electrode P4 in the pixel set U2 of this embodiment are respectively overlapped with a portion of the connecting portion 202a of the auxiliary electrode pattern 202, so as to respectively form the storage capacitors of the two pixel structures in the pixel set U2. Thereby, compared to the conventional pixel array, the pixel array of this embodiment has a relatively high aperture ratio.

In this embodiment, the connecting structure 130 is further disposed between the two adjacent pixel sets U1 and U2, so as to stabilize the voltage between the auxiliary electrode patterns 102 and 202. Since the two pixel structures in each of the pixel sets U1 and U2 together employ the auxiliary electrode pattern as the lower electrodes of the storage capacitors, only one connecting structure 130 is disposed between every two pixel sets (i.e., fourth pixel structures). Namely, in this embodiment, the number of the connecting structures 130 in the pixel array can be reduced, which is also conducive to an increase in the aperture ratio of the pixel array.

It will be apparent to those skilled in the art that various modifications and variations can be made to the present invention without departing from the scope or spirit of the present invention. In view of the foregoing, it is intended that the present invention cover modifications and variations of the present invention provided they fall within the scope of the following claims and their equivalents.

What is claimed is:

1. A pixel array comprising a plurality of pixel sets, each of the pixel sets comprising:
    a first scan line and a second scan line arranged in parallel on a substrate;
    a data line not parallel to the first scan line and the second scan line;
    a first active device electrically connected to the first scan line and the data line;
    a second active device electrically connected to the second scan line and the data line;
    a first pixel electrode electrically connected to the first active device;
    a second pixel electrode electrically connected to the second active device, wherein a gap is between the first pixel electrode and the second pixel electrode;
    an auxiliary electrode pattern having:
        a connecting portion substantially disposed underneath the gap between the first pixel electrode and the second pixel electrode and overlapped with a portion of the first pixel electrode and a portion of the second pixel electrode;
        a first branch portion connected to the connecting portion and overlapped with a portion of the first pixel electrode;
        a second branch portion connected to the connecting portion and overlapped with a portion of the second pixel electrode;
        a third branch portion connected to the connecting portion and overlapped with a portion of the first pixel electrode; and
        a fourth branch portion connected to the connecting portion and overlapped with a portion of the second pixel electrode; and
    a connecting structure electrically connected to the auxiliary electrode patterns in two of the pixel sets adjacent to each other, wherein the connecting structure comprises:
        a bridge structure disposed between the auxiliary electrode patterns in two of the pixel sets adjacent to each other;
        a first contact window disposed in an overlapping region between the bridge structure and the auxiliary electrode pattern in one of the pixel sets; and
        a second contact window disposed in an overlapping region between the bridge structure and the auxiliary electrode pattern in the other one of the pixel sets.

2. The pixel array as claimed in claim 1, wherein
the first contact window is located between the bridge structure and the third branch portion of the auxiliary electrode pattern in the one of the pixel sets; and
the second contact window is located between the bridge structure and the fourth branch portion of the auxiliary electrode pattern in the other one of the pixel sets.

3. The pixel array as claimed in claim 1, wherein the first branch portion, the second branch portion, the third branch portion, and the fourth branch portion of the auxiliary electrode pattern are parallel to the data line.

4. The pixel array as claimed in claim 1, wherein the connecting portion of the auxiliary electrode pattern is parallel to the first scan line and the second scan line.

5. The pixel array as claimed in claim 1, wherein the material of the auxiliary electrode pattern comprises a light-shielding conductive material.

6. The pixel array as claimed in claim 1, wherein the auxiliary electrode patterns in the pixel sets are electrically connected to a common voltage.

7. The pixel array as claimed in claim 1, wherein a film layer where the auxiliary electrode pattern is located is the same as a film layer where the first scan line and the second scan line are located.

8. The pixel array as claimed in claim 1, wherein the connecting portion of the auxiliary electrode pattern has a width greater than a width of the first branch portion, a width of the second branch portion, a width of the third branch portion, and a width of the fourth branch portion.

9. A pixel array comprising a plurality of pixel sets, each of the pixel sets comprising:
    a first scan line and a second scan line arranged in parallel on a substrate;
    a data line not parallel to the first scan line and the second scan line;
    a first active device electrically connected to the first scan line and the data line;
    a second active device electrically connected to the second scan line and the data line;
    a first pixel electrode electrically connected to the first active device;
    a second pixel electrode electrically connected to the second active device;

an auxiliary electrode pattern having:
- a connecting portion substantially disposed underneath a gap between the first pixel electrode and the second pixel electrode;
- a first branch portion connected to the connecting portion, the first branch portion being substantially perpendicular to the connecting portion;
- a second branch portion connected to the connecting portion, the second branch portion being substantially perpendicular to the connecting portion;
- a third branch portion connected to the connecting portion and overlapped with a portion of the first pixel electrode; and
- a fourth branch portion connected to the connecting portion and overlapped with a portion of the second pixel electrode, wherein the connecting portion, the first branch portion, the second branch portion, the third branch portion, and the fourth branch portion are substantially arranged in a shape of letter H; and a connecting structure electrically connected to the auxiliary electrode patterns in two of the pixel sets adjacent to each other, wherein the connecting structure comprises:
- a bridge structure disposed between the auxiliary electrode patterns in two of the pixel sets adjacent to each other;
- a first contact window disposed in an overlapping region between the bridge structure and the auxiliary electrode pattern in one of the pixel sets; and
- a second contact window disposed in an overlapping region between the bridge structure and the auxiliary electrode pattern in the other one of the pixel sets.

10. The pixel array as claimed in claim 9, wherein the first pixel electrode and the second pixel electrode are both located between the first scan line and the second scan line.

11. The pixel array as claimed in claim 9, wherein the first contact window is located between the bridge structure and the third branch portion of the auxiliary electrode pattern in the one of the pixel sets; and
the second contact window is located between the bridge structure and the fourth branch portion of the auxiliary electrode pattern in the other one of the pixel sets.

12. The pixel array as claimed in claim 9, wherein the first branch portion, the second branch portion, the third branch portion, and the fourth branch portion of the auxiliary electrode pattern are parallel to the data line.

13. The pixel array as claimed in claim 9, wherein the material of the auxiliary electrode pattern comprises a light-shielding conductive material.

14. The pixel array as claimed in claim 9, wherein the auxiliary electrode patterns in the pixel sets are electrically connected to a common voltage.

15. The pixel array as claimed in claim 9, wherein a film layer where the auxiliary electrode pattern is located is the same as a film layer where the first scan line and the second scan line are located.

16. The pixel array as claimed in claim 9, wherein the connecting portion of the auxiliary electrode pattern has a width greater than a width of the first branch portion, a width of the second branch portion, a width of the third branch portion, and a width of the fourth branch portion.

* * * * *